US008680171B2

(12) United States Patent
Oliver et al.

(10) Patent No.: US 8,680,171 B2
(45) Date of Patent: Mar. 25, 2014

(54) METHOD OF ENCAPSULATING A PHOTOVOLTAIC CELL AND ENCAPSULATED PHOTOVOLTAIC CELL

(75) Inventors: Joshua M. Oliver, Chicago, IL (US); Jeffrey A. Klang, Exton, PA (US); James P. Horgan, West Chester, PA (US)

(73) Assignee: Arkema France, Colombes (FR)

( * ) Notice: Subject to any disclaimer, the term of this patent is extended or adjusted under 35 U.S.C. 154(b) by 0 days.

(21) Appl. No.: 13/527,722

(22) Filed: Jun. 20, 2012

(65) Prior Publication Data

US 2013/0000725 A1 Jan. 3, 2013

Related U.S. Application Data

(60) Provisional application No. 61/503,844, filed on Jul. 1, 2011.

(51) Int. Cl.
*C08F 2/50* (2006.01)
*C08F 2/46* (2006.01)
*C08G 61/04* (2006.01)

(52) U.S. Cl.
USPC .......................... 522/64; 522/6; 522/1; 520/1

(58) Field of Classification Search
USPC .......................... 522/64, 6, 1; 520/1
See application file for complete search history.

(56) References Cited

U.S. PATENT DOCUMENTS

| 3,178,334 | A | | 4/1965 | Bragaw, Jr. et al. | |
| 4,499,658 | A | * | 2/1985 | Lewis | 438/64 |
| 5,478,402 | A | | 12/1995 | Hanoka | |
| 6,894,123 | B2 | * | 5/2005 | Pelosi et al. | 525/379 |
| 2009/0011230 | A1 | | 1/2009 | Rymer et al. | |
| 2009/0188559 | A1 | * | 7/2009 | Nesbitt | 136/256 |
| 2011/0100454 | A1 | * | 5/2011 | Adam et al. | 136/256 |
| 2012/0067404 | A1 | | 3/2012 | Keller | |

FOREIGN PATENT DOCUMENTS

| JP | 64-001737 A | 1/1989 |
| WO | WO 2010/055507 A2 | 5/2010 |

OTHER PUBLICATIONS

Springborn Laboratories—Encapsulant Materials Manufuacturing Research SP21595 DOE/GO-10096-306 DE96013087—Phase 3A of PVMaT.
Solar Energy Materials and Solar Cells—Characterization of Ethylene Vinyl Acetate (EVA) Encapsulant: Effects of Thermal Processig and Weathering Degradation on its Discoloration,—F.J. Pern and A.W. Czanderna.
Investigation of Test Methods, Material Properties, and Processes for Solar Cell Encapsulants—Ninth Annual Report 1985—Paul B. Willis—Springborn Laboratories, Inc. Enfield, Connecticut. For Jet Propulsion Laboratory, Pasadena, CA.
Solar Collectors—Fianl Report—For Department of Energy, Albuquerque, New Mexico—Technical Monitor—Stanley W. Moore—Springborn Lab., Inc. Enfield, Connecticut—Bernard Baum, and Mark Binette—Jun. 1983.

\* cited by examiner

*Primary Examiner* — Ling Choi
*Assistant Examiner* — Jessica E Whiteley
(74) *Attorney, Agent, or Firm* — Lynn B. Morreale

(57) ABSTRACT

The invention relates to a method of encapsulating a photovoltaic cell comprising curing an encapsulation composition comprising (i) a polyvinyl acetal resin/polymer, (ii) one or more ethylenically unsaturated monomers, oligomers, or a combination thereof, and (iii) at least one thermal free radical initiator and/or at least one photoinitiator. The resin/polymer is either a polyvinyl acetate derivative or a polyvinyl acetate copolymer such as EVA derivative, and comprises vinyl acetal units. The invention also relates to a photovoltaic cell encapsulated according to the method and to the encapsulation curable composition.

16 Claims, No Drawings

METHOD OF ENCAPSULATING A PHOTOVOLTAIC CELL AND ENCAPSULATED PHOTOVOLTAIC CELL

This application claims benefit to U.S. Provisional Application No. 61/503,844 filed on Jul. 1, 2011, which is hereby incorporated by reference in its entirety.

This invention relates to manufacture and construction of photovoltaic solar cell modules, and more particularly to the encapsulation of an interconnected multi-cell array of photovoltaic solar cells. It also relates to methods of encapsulating photovoltaic cells, photovoltaic cell devices resulting from the practice of such methods, and encapsulation compositions useful in the practice of such methods.

Photovoltaic solar cells for directly converting radiant energy from the sun into electrical energy are well known.

As described by Hanoka in U.S. Pat. No. 5,478,402, photovoltaic solar cell modules having an effective working life of 30 years or more have been a well known industry objective. The materials used in constructing modules are selected with concern for providing adequate resistance to damage from impact and physical and thermal shock, maximizing the amount of solar radiation received by the cells, avoiding short-circuiting and electrical leakage, and otherwise minimizing degradation from such environmental factors as moisture, temperature and ultra-violet sunlight-induced chemical reactions. Furthermore, the thirty year useful life objective must be attainable at a commercially acceptable cost.

For various reasons, including convenience of manufacture and assembly, cost control, and protection of the individual cells and their interconnections, it has been common practice to provide modules in the form of laminated structures. These laminated modules consist of front and back protective sheets, with at least the front sheet being made of clear glass or a suitable plastic material that is transparent to solar radiation, and the back sheet being made of the same or a different material as the front sheet. Disposed between the front and back sheets so as to form a sandwich arrangement are the solar cells and a polymer material that encapsulates the solar cells and is also bonded to the front and back sheets. The laminated sandwich-style module is designed to mechanically support the brittle silicon cells and also to protect the cells against environmental degradation.

A particularly limiting factor in improving the useful life of solar cell modules has been the polymer materials used to encapsulate the cells. The tendency of the encapsulants to degrade under the influence of temperature and radiation has long been recognized as a critical problem. Thus prior to this invention, numerous materials were considered for use as encapsulants out of concern for increasing the useful life of solar modules. By way of example, a relatively large number of commercially available transparent polymer materials were surveyed and tabulated by B. Baum and M. Binette, in a 1983 report entitled "Solar Collectors" issued by Springborn Laboratories of Enfield, Conn. and describing an investigation conducted under Government Contract AC04-78CS35359. The polymers reviewed in that report covered a great variation in physical properties and chemistry. Among the polymer materials mentioned in the report were ethylene vinyl acetate copolymer (commonly known as "EVA") and ionomer. As a result of this investigation, twenty (20) transparent polymers were selected for possible use as encapsulants and/or glazings, and of these, EVA was recommended as the best encapsulant. Ionomer was not included in the twenty polymers selected for possible use.

In a second Springborn Laboratories report entitled "Investigation of Materials and Processes for Solar Cell Encapsulation", published August 1986 under JPL Contract 954527 S/L Project 6072.1 and reported by Paul B. Willis, four polymer materials were identified as being superior to all other materials investigated for use as encapsulants in solar cell modules. The four materials selected by the researchers were ethylene vinyl acetate copolymer (EVA), ethylene-methyl acrylate (EMA), butyl acrylate syrup, and aliphatic urethane chemistry polymers. However, EVA was identified in the report as the material offering the best combination of processability, performance, and low cost.

According to Hanoka, supra, as a result of investigations such as that reflected by the second Springborn report, EVA has received wide commercial acceptance as an encapsulant for solar cell modules. Unfortunately, EVA has been found to be a less than ideal solar cell encapsulating material. For example, a well known problem associated with the use of EVA as an encapsulant is the occurrence of progressive darkening of the EVA under intense sunlight. This discoloration can result in a greater than 30% loss in power output of the solar module after only four or more years of exposure to the environment. This phenomena is well documented. F. J. Pern and A. W. Czanderna of the Applied Sciences Branch, National Renewal Energy Laboratory, Golden, Colo., entitled, "Characterization Of Ethylene Vinyl Acetate (EVA) Encapsulation: Effects of thermal processing and weathering degradation on its discoloration", Solar Energy Materials and Solar Cells 25 (1992) 3-23 North-Holland, Elsevier Science Publishers.

The discoloration, which often is a yellow-brown color, results from the EVA chemically degrading under the influence of ultraviolet light. As the EVA decomposes, it releases acetic acid, which in turn acts like a catalyst in the EVA to cause further degradation. It has also been found that the degradation of the EVA may be further accelerated by heat and/or the presence of oxygen.

In the art of encapsulation of photovoltaic cells, the state of the art is to use solid sheets of EVA film and cure under heat and vacuum in spite of these disadvantages.

In the field of safety glass lamination for use in vehicle windshields, the use of a composite interlayer formed of polyvinyl butyral is known and is the state of the art. Bragaw, Jr., et al., in U.S. Pat. No. 3,178,334, disclose a safety-glass laminate having an interior lamina formed by superimposing a sheet of polyvinyl butyral and pressing together.

A photo-setting polyvinyl acetal polymer interlayer for automobile windshields and the like was disclosed by Nakada in Japanese Patent Publication No. 64-001737 published Jan. 6, 1989 prepared from a polyvinyl acetal, plasticizer, curing agent, and photoinitiator.

It is an object of the present invention to provide improved glass to glass lamination for photovoltaic cells and to overcome the problems the art has encountered with EVA technology.

It is another object of the invention to provide an encapsulating material for photovoltaic cells which has improved cure speed versus EVA and can be cured at ambient pressure (atmospheric pressure of about 1 bar) and temperature (about 20±5° C.), rather than requiring a vacuum and heating to elevated temperature as is done with EVA technology.

This object, and others which will become apparent from the following disclosure, are achieved by the present invention which comprises, in one aspect, a method of encapsulating a photovoltaic cell, comprising curing a composition comprising a polyvinyl acetal resin and one or more ethylenically unsaturated monomers, oligomers, or a combination thereof, in the presence of a thermal free radical initiator or/and photoinitiator.

In another aspect, the invention comprises a photovoltaic cell device, comprising a photovoltaic cell (or cells), encapsulated according to the method.

The encapsulation compositions of the invention are suitable for encapsulation of photovoltaic cells in photovoltaic devices. Such photovoltaic devices may include a semiconductor (cell) material including silicon, cadmium sulfide, cadmium telluride, gallium arsenide, and/or other suitable semiconductor materials. The semi-conductor material may be in single crystalline, multi-crystalline, and/or amorphous forms. The photovoltaic systems convert solar radiation into electricity and may be a thin film system or any other suitable photovoltaic system(s). The photovoltaic system may include any type of photovoltaic device with one or more layers covering, partially covering, and/or encapsulating the photovoltaic cells and photovoltaic device. In an exemplary embodiment, photovoltaic device may be a photovoltaic cell. The photovoltaic devices may convert solar radiation of a predetermined wavelength directly into electricity. For example, the photovoltaic device may include fluorescent concentrators oriented toward the sun, in a polymer sheet secured to a material that fluoresces when excited by radiation of the predetermined wavelength.

The first subject of the present invention relates to a method of encapsulating a photovoltaic cell comprising curing an encapsulation composition comprising: at least one polyvinyl acetal resin (the terms resin and polymer are used interchangeably herein and are synonymous), which is a derivative of either polyvinyl acetate or a derivative of a copolymer of vinyl acetate such as a copolymer of vinyl acetate with ethylene (EVA), the resin or polymer comprising vinyl acetal units, and one or more ethylenically unsaturated monomers, oligomers, or a combination thereof, in the presence of thermal free radical initiator or/and photoinitiator.

The meaning of "the resin or polymer is a derivative" of polyvinyl acetate means that the resin comprises polyvinyl acetate structural units. "A resin derivative" of a copolymer like EVA means that the resin comprises structural units of the copolymer (ethylene and vinyl acetate units), either as random or block EVA copolymer.

Preferably, the encapsulating composition is liquid at room temperature (20° C., ±5° C.) and the curing step comprises curing under radiation, preferably UV radiation.

More particularly according to the method of the invention, the encapsulation composition is liquid at room temperature and the curing step comprises curing under UV radiation at ambient pressure which is atmospheric pressure of about 1 bar.

The said polyvinyl acetal resin or polymer may have repeating units of Formula I, as follows:

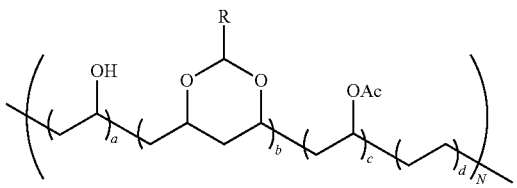

wherein, R is H or a substituted or unsubstituted organic radical, and Ac is an acetate group having the formula —(C=O)CH$_3$, the polyvinyl acetal resin having a weight average molecular weight (measured by GPC) of about 10,000 to about 250,000, preferably from about 10,000 to about 100,000 and having weight percents wherein a is from 0 to about 80 percent, b is from about 20 to about 90 percent, c is from 0 to about 10 percent, and d is from 0 to about 30 percent, with total a+b+c+d equal to 100 percent. N is the number of repeating units of Formula I in accordance with the weight average molecular weight and the relative amounts of a, b, c, and d as indicated herein. Preferably, N is from about 50 to about 1500.

More particularly the said resin is derived from (or is a derivative of) a random or from a block copolymer of vinyl acetate with ethylene (EVA).

According to a more particular embodiment, the said polyvinyl acetal resin or polymer is derived from (or is derivative of) a polyvinyl acetate and has repeating units of Formula II

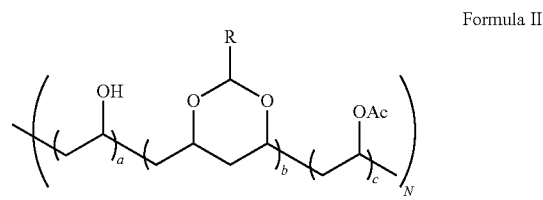

wherein R is H or a substituted or unsubstituted organic radical, and Ac is an acetate group having the formula —(C=O)CH$_3$, the polyvinyl acetal having a weight average molecular weight (measured by GPC) of about 10,000 to about 250,000, preferably from about 10,000 to about 100,000, and preferably have weight percents wherein a is from 0 to about 80 percent, b is from about 20 to about 90 percent, c is from 0 to about 10 percent, with the total a+b+c equal to 100 percent. N is the number of repeating units of Formula II in accordance with the weight average molecular weight and the relative amounts of a, b, and c as indicated herein. Preferably, N is from about 50 to about 1500.

Preferably R is H or a substituted or unsubstituted aliphatic, aromatic, heterocyclic or cycloaliphatic radical, preferably aliphatic or cycloaliphatic radical. More preferably, R is H or a C$_1$ to C$_{22}$ alkyl radical, even more preferably R is an alkyl radical which is C$_1$ to C$_{12}$, and particularly C$_3$ to C$_7$, and more particularly a —C$_3$H$_7$ alkyl radical. The more preferred vinyl acetal unit is vinyl butyral.

In Formulas I and II, the position of each monomeric unit is unlimited in that the monomeric units (e.g., vinyl alcohol, vinyl acetal and vinyl acetate in Formula I or vinyl alcohol, vinyl acetal, vinyl acetate and ethylene in Formula II) may be in a random position in a random copolymer structure or in a random position of a block based on this unit, in a block copolymer structure. Thus, the position of a particular monomeric unit is neither necessarily represented and is not limited by Formulas I or II.

The monomer of the said encapsulation composition is selected from the group consisting of (meth)acrylate esters. The oligomer is selected from the group consisting of urethane (meth)acrylates, epoxy (meth)acrylates, polyester (meth)acrylates and (meth)acrylated acrylic oligomers.

According to one particular embodiment of the invention the monomer, oligomer, or member of a combination thereof, is monofunctional in ethylenic unsaturation. This is desirable for incorporation into a thermoplastic (non-crosslinked) polymeric matrix used to encapsulate the photovoltaic cells. Such compositions provide environmentally beneficial advantages, including easier recycling of raw materials (e.g., the ability to melt and reuse polymer).

The weight ratio of said polyvinyl acetal resin, to said monomer, oligomer, or combination thereof, considering the total weight of all monomers and/or oligomers, is about 1:99 to 99:1 by weight, preferably 5:95 to 95:5 and more preferably 5:95 to 50:50.

The curable encapsulation composition may comprise a photoinitiator in case of UV-cure or/and a thermal free radical initiator in case of thermal cure.

Another embodiment of the invention comprises a step of curing in the presence of a photoinitiator selected from monoacyl phosphine oxide, bisacyl phosphine oxide, and combinations thereof. This is the case of UV curable composition. The photoinitiator may be added or is present in the encapsulation composition at about 0.25 to 8% by weight, preferably from about 0.25 to 5% by weight.

According to another embodiment of the method of the invention comprises a step of encapsulating a photovoltaic cell comprising the step of curing an encapsulation composition, in the presence of a thermal free radical initiator selected from the group consisting of organic peroxides and azo compounds.

As used herein, "curable composition" (either radiation-curable or thermal free radical initiator (peroxide or azo compounds)) means that a composition polymerizes and/or is capable of polymerization, regardless of whether the composition includes monomers or/and oligomers that are multi-functional or monofunctional in terms of ethylenic unsaturation. Monofunctional ethylenic unsaturation may provide a final cured encapsulation composition that is thermoplastic and recyclable, whereas with multifunctional ethylenic unsaturation, a crosslinked polymer may result.

According to the method of the invention, said encapsulation composition may comprise in addition, one or more additives selected from light stabilizers, UV absorbents, adhesion promoters, flow additives, and nano silica oxides.

In addition to the polyvinyl acetal resin, the composition used in the method comprises one or more ethylenically unsaturated monomers, oligomers, or a combination thereof. Preferably the ethylenically unsaturated monomers are (meth)acrylate functional monomers. More preferably, but not intended to be limiting, the (meth)acrylate monomers are esters with aliphatic, cyloaliphatic, bicyclic or tricyclic backbones which can provide weather resistant and non-yellowing properties. Examples of such (meth)acrylate monomers and oligomers are hexanediol diacrylate, decanediol diacrylate, dodecanediol diacrylate, tricyclodecane dimethanol diacrylate, 3,3,5-trimethylcyclohexyl acrylate, ethoxylated trimethylolpropane triacrylate, cyclic trimethylolpropane formal acrylate, octyl acrylate/decyl acrylate, b-carboxyethyl acrylate, 3-methyl pentanediol diacrylate, 1,3 propanediol dimethacrylate, alkoxylated lauryl acrylate, 1,4 butanediol diacrylate, 1,3 butanediol diacrylate, lauryl acrylate, behenyl acrylate, stearyl acrylate, caprolactone acrylate, and isodecyl acrylate. Likewise, preferably the ethylenically unsaturated oligomers are (meth)acrylate functional urethane (meth)acrylate, polyester (meth)acrylate or epoxy (meth)acrylate compositions.

Examples include urethane (meth)acrylates prepared from aliphatic isocyanates such as isophorone diisocyanate, dicyclohexylmethane diisocyanate, hexamethylene diisocyanate, trimethyl hexamethylene diisocyanate, or oligomeric or polymeric derivatives of these and alcohols or polyols based on aliphatic, polycarbonate, polyester or polyether backbones and a (meth)acrylating agent such as hydroxyethyl (meth)acrylate, hydroxypropyl (meth)acrylate, pentaerythritol triacrylate or caprolactone (meth)acrylate. Further examples are polyester (meth)acrylates derived from di- or higher functionality hydroxylic and carboxylic acid components and (meth)acrylic acid. Additional examples include aliphatic epoxy (meth)acrylateoligomers based on glycidyl ethers such as 1,4-butanediol diglycidyl ether, hydrogenated his-phenol A diglycidyl ether, trimethylolpropane triglycidyl ether or carboxylic acid glycidyl esters or epoxidized vegetable oils such as soya bean or linseed oils. Further examples will be apparent to those skilled in the art.

(Meth) acrylated acrylic oligomers are for example obtained by co-oligomerizing a (meth)acrylic ester with an epoxy functional (meth)acrylate, such as glycidyl methacrylate (or 2,3-epoxypropyl methacrylate) and then esterifying the epoxy groups by (meth)acrylic acid.

In most embodiments the ratio of polyvinyl acetal resin to monomer, oligomer, or combination thereof, which means with respect to the total weight of all monomers and/or oligomers, is about 1:99 to 99:1 by weight, preferably about 5:95 to 95:5 by weight, and more preferably about 5:95 to 50:50 by weight.

The encapsulation composition can be a solid or liquid. In embodiments wherein the encapsulation composition is in the form of a liquid, the composition preferably has a viscosity below about 20,000 mPa·s (cP) preferably 15,000 mPa·s (cP) at 60° C. and is liquid at room temperature or application temperature. When the encapsulation composition is a liquid it can be applied, for example, by contacting the composition with the photovoltaic cell surfaces to be encapsulated and then curing. To achieve desired viscosity, preferably the polyvinyl acetal resin concentration in the composition is less than 50% by weight, and more preferably less than 30% by weight, based on overall encapsulation composition.

The liquid encapsulation composition of the invention can be used to encapsulate photovoltaic cells which are flexible or which are contained in rigid structures.

In embodiments wherein the composition is a solid, the composition can be in sheet form and can be applied by vacuum lamination and can be cured at ambient conditions by exposure to actinic radiation such as UV or can be cured by heating in embodiments wherein the sheet comprises peroxide.

In embodiments which are cured in the presence of actinic radiation, the composition usually comprises a photoinitiator, examples of which are selected from monoacyl phosphine oxide, bisacyl phosphine oxide, and combinations thereof. A preferred source of actinic radiation is UV. In embodiments which are cured by UV or other actinic radiation, some care should be taken to ensure bubbles are not trapped but in most embodiments vacuum is not necessary, which is an improvement over traditional prior art systems for encapsulation of photovoltaic cells.

In embodiments which are heat cured, the composition comprises a thermal free radical initiator. Suitable thermal free radical initiator include, for example, organic peroxides and azo compounds as are known in the art.

The compositions can include one or more additives selected from light stabilizers, UV absorbents, adhesion promotors, flow additives, nano silica oxides, additives to promote flow, leveling, bubble release, and substrate wetting. In some embodiments the encapsulant composition can include a plasticizer.

Although it is preferred that the composition be a liquid encapsulant which is cured by UV radiation, the composition can be cured by heat or other forms of actinic radiation to encapsulate a photovoltaic cell.

Another aspect of the present invention relates to a photovoltaic cell, particularly a photovoltaic cell device, with the photovoltaic cell (meaning generally cells) is encapsulated under heat or radiation according to the methods disclosed herein. More particularly, in the photovoltaic cell device, the cured encapsulation composition has a UV visible light transmittance of about 85% to about 99%, preferably from about 90 to about 99%. Preferably, in the said photovoltaic cell device as disclosed herein, the cured encapsulation composition, has freeze-thaw properties which pass a humidity-freeze test according to ASTM E-1171, sections 6.5 and 6.6 freeze-thaw test protocol.

It is equally a subject of the present invention a photovoltaic cell device, where said photovoltaic cell is encapsulated by using a curable composition as defined above according to any embodiment of the invention.

Finally the present invention includes a curable composition, in particular suitable for encapsulating a photovoltaic cell, which comprises:
- at least one polyvinyl acetal resin (or polymer), which is a derivative of either polyvinyl acetate or of a copolymer of vinyl acetate such as a copolymer of vinyl acetate with ethylene (EVA), the said resin or polymer comprising vinyl acetal units, and
- one or more ethylenically unsaturated monomers, oligomers, or a combination thereof,
- at least one thermal free radical initiator or/and at least one photoinitiator.

The cured encapsulants have very good light transmittance qualities and in some embodiments the cured composition has a UV visible light transmittance of about 85% to about 99%.

The following examples illustrate certain embodiments of the invention and comparative examples in which all parts are by weight. The invention is capable of many other embodiments and should not be considered as being limited in any way to the illustrative embodiments.

EXAMPLE 1

Preparation of Encapsulation Composition

A liquid encapsulation composition was prepared with 38.75 parts of a polyvinyl acetal resin (Butvar$^R$ brand from Solutia), 60 parts trimethylcyclohexyl acrylate, 0.25 parts bisacylphosphine photoinitiator (Ciba IRG 819 brand), and 1 part tris phosphine oxide (TPO).

EXAMPLE 2

Preparation of Test Films

Films were prepared by curing the liquid composition of Example 1 under UV radiation (at 3 J/cm$^2$). Encapsulation of PV cell is made by prior impregnation (immersion) of said cell in said curable composition before said curing.

EXAMPLE 3

Testing Encapsulation Compositions

Films between 90 and 170 mils thickness were subjected to 5 cycles of a freeze thaw test between 85° C. and 85% of relative humidity to −15° C., according to ASTM E-1171, sections 6.5 and 6.6 freeze-thaw test protocol.

The films exhibited no cracking, low shrinkage, good adhesion, were tack free, and had only slight haze with light transmittance value higher than 90%.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

The invention claimed is:

1. A method of encapsulating a photovoltaic cell comprising the step of curing an encapsulation composition, wherein said curing step comprises applying UV radiation at ambient pressure and temperature,
   the encapsulation composition being liquid at room temperature and comprising:
   at least one polyvinyl acetal resin which is a derivative of either polyvinyl acetate or vinyl acetate copolymer,
   wherein the polyvinyl acetal resin has repeating units of Formula I:

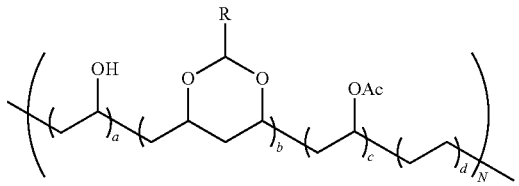

Formula I wherein R is H or a substituted or unsubstituted organic radical, and Ac is an acetate group having the formula —(C=O)CH$_3$, the polyvinyl acetal resin having a weight average molecular weight of about 10,000 to about 250,000, and wherein the weight percent of a is from 0 to about 80, the weight percent of b is from about 20 to about 90, the weight percent of c is from about 0 to about 10, and the weight percent of d is greater than 0 and up to about 30, wherein the total weight percent of a+b+c+d is 100 percent, and where N is from about 50 to about 1500,
   the resin comprising vinyl acetal units, and one or more ethylenically unsaturated monomers, oligomers, or a combination thereof, and at least one thermal free radical initiator or/and at least one photoinitiator.

2. The method according to claim 1 wherein the resin is derived from random or block copolymer of vinyl acetate and ethylene.

3. The method according to claim 1 wherein R is H or a substituted or unsubstituted aliphatic, aromatic, heterocyclic or cycloaliphatic radical.

4. The method according to claim 1 wherein R is H or a C$_1$ to C$_{22}$ alkyl radical.

5. The method according to claim 1 wherein R is an alkyl radical which is C$_1$ to C$_{12}$.

6. The method according to claim 1 wherein R is an alkyl radical which is a C$_3$H$_7$ alkyl radical.

7. The method according to claim 1 wherein the monomer is selected from the group consisting of (meth)acrylate esters and said oligomer is selected from the group consisting of urethane (meth)acrylates, epoxy (meth)acrylates, (meth)acrylated acrylic oligomers and polyester (meth)acrylates.

8. The method according to claim 1 wherein the monomer, oligomer, or combination thereof is monofunctional in ethylenic unsaturation.

9. The method according to claim 1 wherein the weight ratio of said polyvinyl acetal resin to said monomer, oligomer, or combination thereof is about 1:99 to 99:1 by weight based on the total weight of monomer, and/or oligomers.

10. The method according to claim 1 wherein the encapsulation composition has a viscosity below about 20,000 mPa·s (cP) at 60° C.

11. The method according to claim 1 wherein said curing step is carried out in the presence at least one photoinitiator selected from the group consisting of monoacyl phosphine oxide and bisacyl phosphine oxide, wherein said photoinitiator is in said encapsulation composition at about 0.25 to 8 percent by weight.

12. The method according to claim 1 wherein said curing step is carried out in the presence of a thermal free radical initiator selected from the group consisting of organic peroxides and azo compounds.

13. A photovoltaic cell, wherein said photovoltaic cell is encapsulated according to the method of claim 1.

14. The photovoltaic cell device of claim 13 wherein the cured encapsulation composition has a UV visible light transmittance of about 85% to 99%.

15. The photovoltaic cell device of claim 13 wherein the cured encapsulation composition has freeze-thaw properties which pass a humidity-freeze test according to ASTM E-1171, sections 6.5 and 6.6 freeze-thaw test protocol.

16. A curable composition suitable for encapsulating a photovoltaic cell, said composition being liquid at room temperature and curable by applying UV radiation at ambient pressure and temperature, said composition comprising:

at least one polyvinyl acetal resin which is a derivative of either polyvinyl acetate or vinyl acetate copolymer, wherein the polyvinyl acetal resin has repeating units of Formula I:

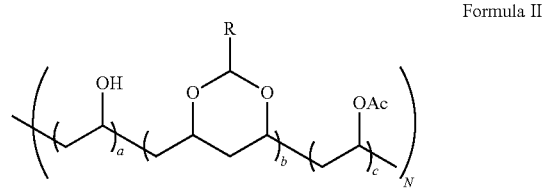

Formula II wherein R is H or a substituted or unsubstituted organic radical, and Ac is an acetate group having the formula —(C═O)CH$_3$, the polyvinyl acetal resin having a weight average molecular weight of about 10,000 to about 250,000, and wherein the weight percent of a is from 0 to about 80, the weight percent of b is from about 20 to about 90, the weight percent of c is from about 0 to about 10, and the weight percent of d is greater than 0 and up to about 30, wherein the total weight percent of a+b+c+d is 100 percent, where N is from about 50 to about 1500, the resin comprising vinyl acetal units, and one or more ethylenically unsaturated monomers, oligomers, or a combination thereof, and at least one thermal free radical initiator or/and at least one photoinitiator.

* * * * *